(12) United States Patent
Chien

(10) Patent No.: US 11,449,040 B2
(45) Date of Patent: Sep. 20, 2022

(54) CLEANING DEVICE FOR DISPLAY PANEL

(71) Applicants: HKC Corporation Limited, Guangdong (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD, Chongqing (CN)

( * ) Notice: Subject to any disclaimer, the term of this patent is extended or adjusted under 35 U.S.C. 154(b) by 254 days.

(21) Appl. No.: 16/614,885

(22) PCT Filed: Jul. 28, 2017

(86) PCT No.: PCT/CN2017/094868
§ 371 (c)(1),
(2) Date: Nov. 19, 2019

(87) PCT Pub. No.: WO2018/209816
PCT Pub. Date: Nov. 22, 2018

(65) Prior Publication Data
US 2020/0110391 A1    Apr. 9, 2020

(30) Foreign Application Priority Data

May 19, 2017   (CN) .......................... 201710361329.4

(51) Int. Cl.
*G05B 19/418*    (2006.01)
*B08B 3/02*     (2006.01)
(Continued)

(52) U.S. Cl.
CPC .......... *G05B 19/41875* (2013.01); *B08B 3/02* (2013.01); *B08B 3/022* (2013.01);
(Continued)

(58) Field of Classification Search
CPC ........ B08B 13/00; B08B 11/04; B08B 3/022; B08B 3/02; G02F 1/1303; G02F 1/1316;
(Continued)

(56) References Cited

U.S. PATENT DOCUMENTS

2003/0143491 A1* 7/2003 Lu .......................... G03F 7/3042
430/315
2003/0196689 A1* 10/2003 Lee .......................... H01J 9/38
134/102.1
(Continued)

FOREIGN PATENT DOCUMENTS

CN    2423962 Y    3/2001
CN    2868930 Y    2/2007
(Continued)

*Primary Examiner* — Benjamin L Osterhout
(74) *Attorney, Agent, or Firm* — Muncy, Geissler, Olds & Lowe, P.C.

(57) ABSTRACT

A cleaning device for a display panel is configured with a sensor corresponding to a water jet nozzle, and a control switch which suspends an operation of the device when the water jet nozzle is detected as working abnormally, thereby preventing abnormal products from being produced due to the failure of finding an abnormal condition of the water jet nozzle in time, ensuring the normal process of the product, and preventing the nonessential economic loss.

20 Claims, 3 Drawing Sheets

(51) Int. Cl.
*B08B 13/00* (2006.01)
*G02F 1/13* (2006.01)
*B08B 11/04* (2006.01)
*H01L 21/677* (2006.01)
*H01L 21/67* (2006.01)
*B65G 49/06* (2006.01)

(52) U.S. Cl.
CPC .............. *B08B 11/04* (2013.01); *B08B 13/00* (2013.01); *B65G 49/063* (2013.01); *G02F 1/1303* (2013.01); *G02F 1/1316* (2021.01); *H01L 21/67051* (2013.01); *H01L 21/6776* (2013.01); *H01L 21/67253* (2013.01); *H01L 21/67288* (2013.01); *H01L 21/67718* (2013.01)

(58) Field of Classification Search
CPC ......... H01L 21/67051; H01L 21/67288; H01L 21/67253; H01L 21/67718; H01L 21/6776; G05B 19/41875; B65G 49/063
See application file for complete search history.

(56) References Cited

U.S. PATENT DOCUMENTS

| | | | |
|---|---|---|---|
| 2013/0061877 A1* | 3/2013 | Nakagawa | B24C 1/003 134/7 |
| 2013/0249838 A1* | 9/2013 | Nakagawa | G06F 3/0443 345/173 |
| 2015/0136185 A1* | 5/2015 | Jo | B08B 3/022 134/103.2 |
| 2015/0244311 A1* | 8/2015 | Nakagawa | B08B 1/008 134/180 |
| 2019/0181799 A1* | 6/2019 | Naffa'A | G01N 21/17 |

FOREIGN PATENT DOCUMENTS

| | | |
|---|---|---|
| CN | 204148198 U | 2/2015 |
| CN | 205008296 U | 2/2016 |
| CN | 205732094 U | 11/2016 |
| CN | 205762560 U | 12/2016 |
| CN | 106482774 A | 3/2017 |
| JP | H06156678 A | 6/1994 |
| JP | 2006297207 A | 11/2006 |

* cited by examiner

CLEANING DEVICE FOR DISPLAY PANEL

BACKGROUND

Technical Field

This disclosure relates to an electronic technical field, and more particularly relates to a cleaning device for a display panel.

Related Art

A water knife cleaning device has been widely applied to a cleaning process of a thin film transistor liquid crystal display (TFT-LCD). In the TFT process, a high pressure water knife cleaning device is used in the developing section, the wet etching section and the photoresist removing section to wash away the remaining chemical liquid and to keep the glass surface neutral. Usually, the water knife device will use a nozzle mechanism to perform a wide range of glass cleaning process. Some of the nozzle mechanisms are blocked by impurities in the water due to the long term of use, so some areas of the glass cannot be cleaned to cause the remained chemical liquid and the product reliability problems. Human eyes are usually used to determine and monitor whether the nozzle mechanism of the water knife works normally during the maintenance of the apparatus. So, whether the nozzle mechanism works normally cannot be obtained in time. When the nozzle is found to be abnormal, a lot of abnormal products have been produced.

SUMMARY

This disclosure provides a cleaning device for a display panel, which can immediately monitor whether the cleaning work is normal to avoid the production of abnormally cleaned products.

In one aspect, this disclosure provides a cleaning device for a display panel comprising:

a frame comprising a body for mounting the cleaning device and a stand supporting the body;

a water knife component comprising a water jet nozzle, a water supply tank connected to the water jet nozzle through a pipeline, and a regulating device controlling a spray intensity of the water jet nozzle;

a transfer component comprising a transport platform for transporting the display panel to be cleaned by the water jet nozzle;

a discharge component comprising a recycle tank for recycling sewage and a water cover covering two sides of the transport platform to prevent the sewage from splashing;

a detection component comprising a sensor disposed in correspondence with the water jet nozzle to detect whether the water jet nozzle works normally; and a control switch electrically connected to the sensor and controlling the cleaning device to suspend when the sensor detects that the water jet nozzle works abnormally.

In one aspect, this disclosure provides a cleaning device for a display panel comprising:

a frame comprising a body for mounting the cleaning device and a stand supporting the body;

a water knife component comprising a water jet nozzle, a water supply tank connected to the water jet nozzle through a pipeline, and a regulating device controlling a spray intensity of the water jet nozzle;

a transfer component comprising a transport platform for transporting the display panel to be cleaned by the water jet nozzle;

a discharge component comprising a recycle tank for recycling sewage, and a water cover covering two sides of the transport platform to prevent the sewage from splashing, wherein the water cover is made of a transparent material;

a detection component comprising a sensor disposed in correspondence with the water jet nozzle to detect whether the water jet nozzle works normally; and a control switch electrically connected to the sensor and controlling the cleaning device to suspend when the sensor detects that the water jet nozzle works abnormally.

In one aspect, this disclosure provides a water knife component, which is applied to the cleaning device, and comprises:

a water jet nozzle;

a water supply tank connected to the water jet nozzle through a pipeline; and a regulating device controlling a spray intensity of the water jet nozzle.

The cleaning device of this disclosure is provided with a sensor, which corresponds to the water jet nozzle and detects whether the water jet nozzle works normally, and a control switch, which receives a signal from the sensor and suspends an operation of the device when the water jet nozzle is detected as working abnormally, thereby preventing abnormal products from being produced due to the failure of finding an abnormal condition of the water jet nozzle in time, ensuring the normal process of the product, and preventing the nonessential economic loss.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

In order to provide the better understanding of this disclosure to those skilled in the art, the technical solution in the embodiments of this disclosure will be clearly described with reference to the accompanying drawings in the embodiments of this disclosure. Obviously, the described embodiment is the embodiment one portion of the module of this disclosure, rather than the embodiment of the entire module. All other embodiments obtained by those skilled in the art based on the embodiments of this disclosure without making creative work are deemed as falling within the scope of this application.

The specification and claims of this disclosure, and the terms "comprising" in the above-mentioned drawings and any variations thereof intend to cover the non-exclusive inclusion. For example, a process, method, system, product or device comprising a series of steps or units is not limited to the listed steps or units, but may further optionally comprise steps or units not listed, or alternatively comprise other steps or units inherent to these processes, methods, products or equipment. In addition, the terms "first," "second" and "third" are used to distinguish between different objects and not for describing a particular order.

To be noted, the terms disclosed in this disclosure are for describing some specific embodiments and are not to limit this disclosure. Throughout the specification and claims, the terms "a" and "one" can be realized as "one or more", unless the context clearly dictates otherwise elsewhere.

Figure 1:
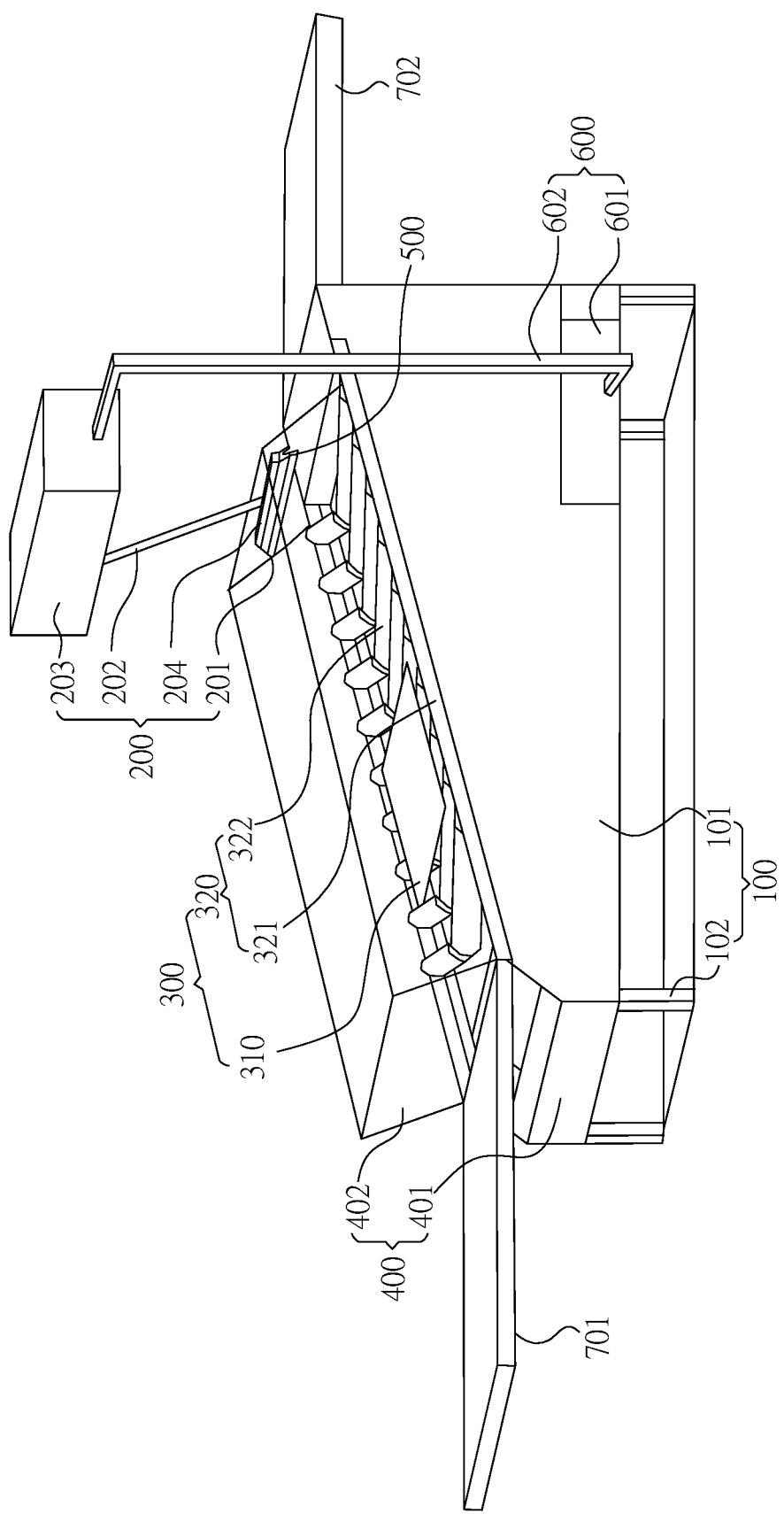
FIG. 1 is a schematic structure view showing a cleaning device for a display panel provided by an embodiment of this disclosure.

Referring to FIG. 1, a cleaning device for a display panel provided by this disclosure comprises a frame 100 comprising a body 101 for mounting of the cleaning device and a stand 102 for supporting the body 101; a water knife component 200 comprising a water jet nozzle 201, a water supply tank 203 connected to the water jet nozzle 201 through a pipeline 202 and a regulating device 204 controlling a spray intensity of the water jet nozzle 201; a transfer component 300 comprising a transport platform 320 for transporting a display panel 310 to be washed by the water jet nozzle 201; a discharge component 400 comprising a recycle tank 401 for recycling sewage, and a water cover 402 covering two sides of the transport platform 320 to prevent the sewage from splashing; a detection component comprising a sensor 500 disposed in correspondence with the water jet nozzle 201 to detect whether the water jet nozzle 201 works normally; And a control switch electrically connected to the sensor 500 and controlling the overall cleaning device to suspend an operation when the sensor 500 detects that the water jet nozzle 201 works abnormally.

Specifically, the display panel 310 is transported, by a front transport platform 701, into the cleaning device provided by an embodiment of this disclosure for cleaning, and is conveyed by a post transport platform 702 to the next process after the cleaning is completed. The display panel is transported, by the front transport platform 701, into the transport platform 320 of the cleaning device provided by an embodiment of this disclosure, and the display panel 310 is driven by the transport platform 320 to the cleaning range of the water jet nozzle 201 for cleaning. Before the display panel 310 is conveyed to the cleaning position, the water jet nozzle 201 is opened in advance. The sensor 500 detects whether the water jet nozzle 201 works normally. If the detection is normal, then the transporting of the display panel 310 starts to perform the cleaning operation. If the detection is abnormal, then the control switch controls the overall cleaning device to suspend the operation, and reminds the operator to perform the detecting and troubleshooting.

By disposing the sensor 500 in correspondence with the water jet nozzle 201 to detect whether the water jet nozzle 201 works normally, and the control switch which receives a signal from the sensor 500 and suspends the operation of the device when the water jet nozzle 201 is detected as working abnormally, it is possible to prevent abnormal products from being produced due to the failure of finding an abnormal condition of the water jet nozzle 201 in time, thereby ensuring the normal process of the product, and avoiding the nonessential economic loss.

Specifically, if the sensor 500 detects the water jet nozzle 201 as working normally, then the display panel 310 is driven by the transport platform 320 to the cleaning range of the water jet nozzle 201 for cleaning. The recycle tank 401 for recycling the sewage is disposed below the transport platform to recycle the sewage produced after cleaning, and the water cover 402 is provided on two sides of the transport platform to prevent the sewage, produced when the water jet nozzle 201 cleans the display panel 310, from splashing.

Specifically, the water jet nozzle 201 can be a flat strip shaped structure, and the nozzle holes thereof for spraying the cleaning solution may be disposed on the end portion of the water jet nozzle 201 and are aligned with the flat strip shaped openings of the transport platform 320, or may be disposed on the end portion of the water jet nozzle 201 and in the form of fine spray holes arranged in columns and rows in an equally spaced manner. For example, an interval distance of each small spray hole is set to be 3 to 4 mm, and the diameter of the specific small spray hole can be adjusted according to the actual requirement.

Specifically, the water cover 402 can be made of a transparent material, such as glass, transparent plastic or the like. The water cover 402 may be disposed in a manner close to the transport platform 320 along the outer side of the transport platform 320. Using the water cover 402 made of the transparent material allows the intuitive convenient observation on the cleaning operation inside the display panel 310, and facilitates the controlling of the cleaning condition. An operation window that may be pushed and pulled may also be formed on the water cover 402, so that the operator can open the window to perform the operation when the operator needs to perform the operation in the water cover 402.

Further, the sensor 500 for detecting whether the water jet nozzle 201 works normally is a photosensor, and the photosensor is disposed below the water jet nozzle 201.

Specifically, the photosensor may be an infrared sensor, and the monitoring position of the infrared sensor is at the nozzle of the water jet nozzle 201 to sense whether the nozzle of the water jet nozzle 201 can normally spray the cleaning solution. The working condition of the water jet nozzle 201 is monitored by the infrared sensor, and the responding action can be made immediately when the water jet nozzle 201 becomes abnormal. For example, the signal is sent to the control switch in this embodiment to make the control switch suspend the operation of the overall device, thereby avoiding the nonessential loss.

Figure 2:
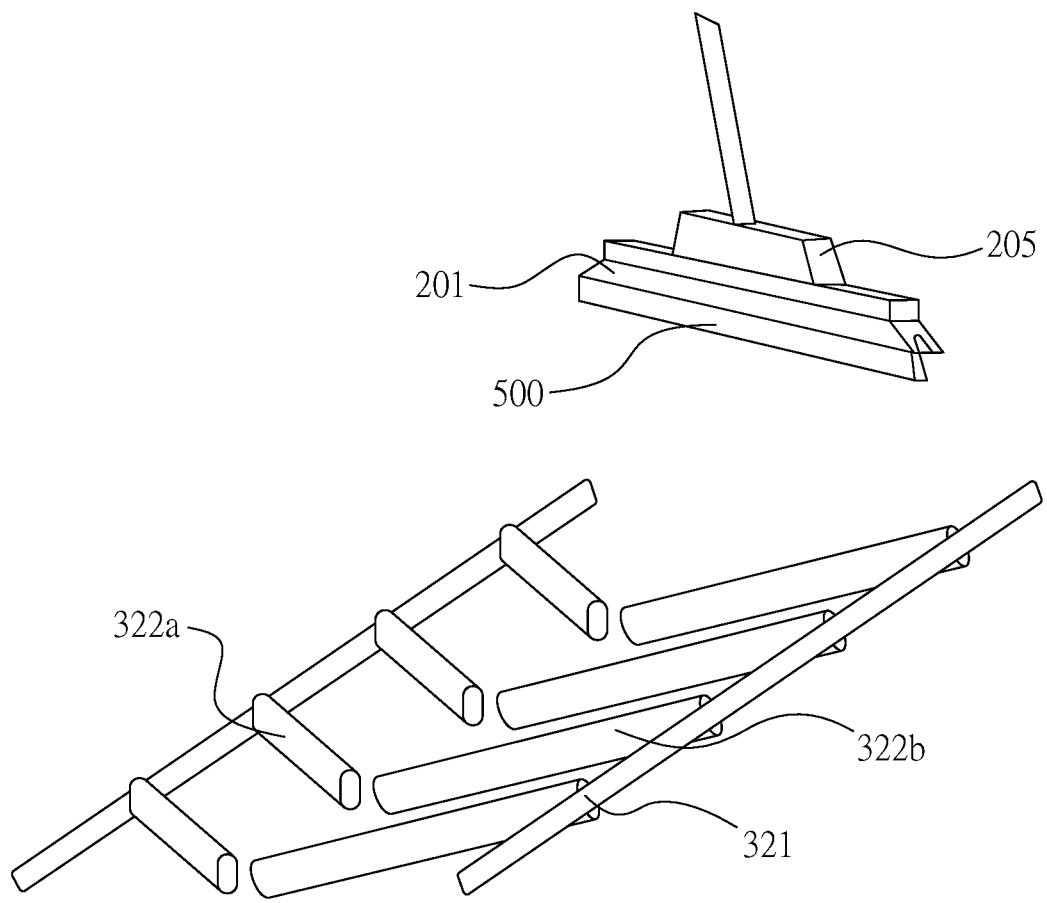
FIG. 2 is an enlarged partial view showing a cleaning device for a display panel provided by an embodiment of this disclosure.

Referring further to FIGS. 1 and 2, the transport platform 320 comprises roller stands 321 arranged in parallel along the conveying direction, and conveying rollers 322, which are parallelly interposed between the roller stands 321 and for transporting the display panel 310.

Furthermore, one side of the roller stand 321 near the water jet nozzle 201 is tilted up by a predetermined angle, so that the conveyed display panel 310 meets the water jet nozzle 201 at the predetermined angle in an upwardly tilted manner.

Furthermore, each of the conveying rollers 322 comprises two sub-rollers 322a and 322b fixed in a V shape, and an included angle of the V shape is directed to the conveying direction of the display panel 310.

Specifically, the display panel 310 is conveyed to the transport platform 320, and then driven by the conveying rollers 322 to move forward continuously. One side of the roller stand 321 near the water jet nozzle 201 is tilted up by a predetermined angle, so that the conveyed display panel 310 meets the water jet nozzle 201 at the predetermined angle in an upwardly tilted manner to prevent the sewage, produced when the display panel 310 is rinsed by the water jet nozzle 201, from flowing to the rinsed portion of the display panel 310 to cause the secondary contamination, so that the flowing directions of the sewage after rinsing are consistent. For example, one side of the roller stand 321 near the water jet nozzle 201 is tilted up by 30°, and the display panel has an 30° inclined surface upon being cleaned. The cleaning sewage flows to the surface that has not yet been cleaned along the surface of the display panel without flowing to the upper cleaned surface, so that the secondary contamination after cleaning can be avoided. Meanwhile, the two sub-rollers 322a and 322b are used to form a V-shaped structure directed to the conveying direction of the display panel 310, so that the display panel 310 is always kept at the middle position of the transporting path when being transported to prevent the transported display panel 310 from shaking on two sides, or even knocking when being transported to the edge. The V-shaped included angle formed by the two sub-rollers may be configured according to the actual condition. The lengths of the two sub-rollers are the same and symmetrically distributed along the transporting path of the display panel. Thus, the display panel can be finally controlled to locate at the middle position of the conveying roller 322 no matter where the display panel is placed on the conveying roller 322.

Furthermore, the surface of the conveying roller 322 is provided with an anti-slip sleeve.

Specifically, the rinsing liquid is remained on the conveying roller 322 under the rinsing of the water jet nozzle 201, a certain slip is caused when the display panel 310 is on the surface of the conveying roller 322, and the provision of the anti-slip sleeve enables the display panel 310 to be firmly attached to the conveying roller 322 upon rinsing. The provided anti-slip sleeve may be an entire anti-slip material covering the surface of the conveying roller 322, or an anti-slip ring is fitted with the surface of one portion of the conveying roller 322 as long as the objective of preventing the transported display panel 310 slipping can be achieved.

Referring further to FIG. 2, the water knife component 200 further comprises a vibrator 205 for driving the water jet nozzle 201 to vibrate back and forth horizontally in a direction perpendicular to the conveying direction.

Specifically, the provision of the vibrator 205 for driving the water jet nozzle 201 to vibrate back and forth horizontally in a direction perpendicular to the conveying direction can make the display panel 310 be rinsed cleaner, and can enhance the rinsing efficiency.

Furthermore, the jetting direction of the water jet nozzle 201 is tilted at a predetermined angle toward the direction in which the display panel 310 is conveyed.

Specifically, adjusting the jetting direction of the water jet nozzle 201 can make the rinsing water flow of the water jet nozzle 201 slantingly contact the display panel 310, so that the rinsed sewage has the consistent flowing directions, and the rinsing effect can be enhanced at the same time.

In some embodiments, the display panel 310 may be, for example, a twisted nematic liquid crystal display panel, an in-plane switching liquid crystal display panel or a multi-domain vertical alignment liquid crystal display panel, an organic electroluminescent semiconductor display panel (OLED), a quantum dot display panel (QLED), a curved surface display panel or other display panels.

Figure 3:
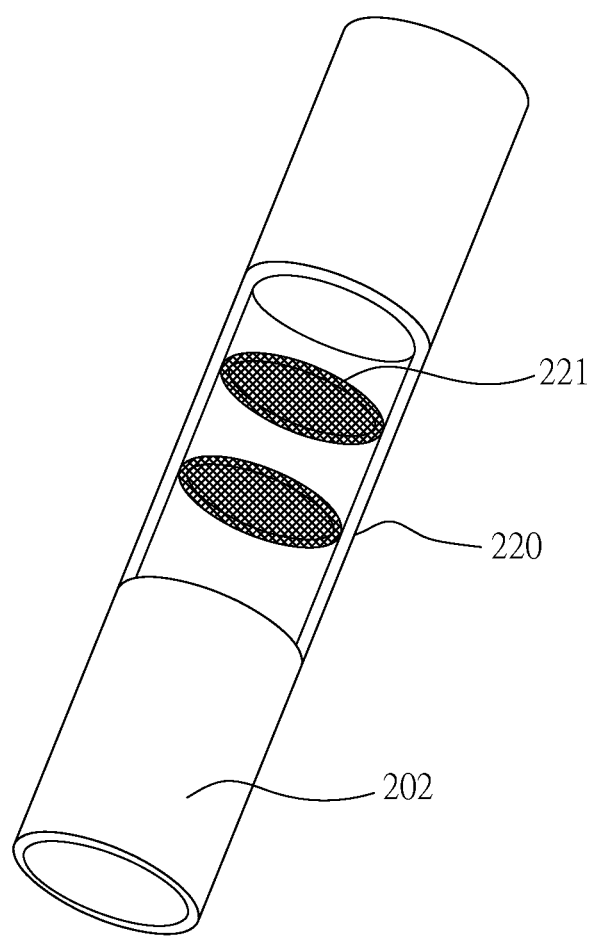
FIG. 3 is another partial schematic view showing a cleaning device for a display panel provided by an embodiment of this disclosure.

Referring further to FIG. 3, the pipeline 202 between the water jet nozzle 201 and the water supply tank 203 comprises a detachable filter tube 220, and a filter 221 is disposed inside the filter tube 220.

Specifically, the provision of a section of filter tube 220 on the pipeline 202, and the provision of the filter 221 in the filter tube 220 can effectively block the impurities in the water supply tank 203 from flowing to the water jet nozzle 201 to disable the overall device from operating normally due to the impurities blocking the water jet nozzle 201. Meanwhile, the filter tube 220 is detachable, and fixed and connected to the pipeline 202 by way of threading, so that the detachment is convenient, and the impurities in the pipeline 202 can be conveniently cleaned.

Referring further to FIG. 1, the cleaning device of the display panel 310 provided by an embodiment of this disclosure further comprises a sewage loop component 600, which comprises a sewage purification tank 601 connected to the recycle tank 401. The sewage in the sewage purification tank 601 is purified and then pumped, by a motor, to the water supply tank 203 and is recycled.

Specifically, the sewage accommodated within the recycle tank 401 is pumped to the sewage purification tank 601, and purified by the sewage treating system in the sewage purification tank 601, and the purified sewage is again pumped into the water supply tank 203 through the loop pipeline 602 and is recycled. Because a lot of rinse needs to be used in the rinsing process, the recycling loop utilization can effectively save the rinse cost. Meanwhile, the sewage discharge may be decreased, thereby decreasing the contamination to the environment.

Referring continuously to FIG. 1, the entire operation flow of the cleaning device of the display panel in the present embodiment will be described below.

Before the to-be-cleaned display panel 310 is conveyed to the cleaning device, it is firstly checked whether or not the working performance of the cleaning device is normal by mainly detecting whether the water jet nozzle 201 of the cleaning device operates normally. The water jet nozzle 201 is opened in advance, the cleaning solution inside the water supply tank 203 is delivered from the pipeline 202 to the water jet nozzle 201, and the cleaning solution is sprayed by the water jet nozzle 201. At this time, the sensor 500 starts to detect whether the water jet nozzle 201 works normally by specifically detecting whether each of the preset cleaning positions is rinsed by the water jet nozzle 201, or detecting whether each of the spray holes of the water jet nozzle 201 can spray the cleaning solution normally. If the sensor 500 detects that the water jet nozzle 201 works normally, then the front transport platform 701 starts to transport the display panel 310 into the cleaning device. The display panel 310 enters the cleaning device and is then continuously driven by the conveying rollers 322 into the region where the water jet nozzle 201 can be rinsed, and then rinsed therein. After rinsing is completed, the conveying rollers 322 transport the display panel 310 onto the post transport platform 702, which transports the display panel 310 to the next process. If the sensor 500 detects that the water jet nozzle 201 works abnormally, then the control switch controls the overall cleaning device to suspend the operation and to remind the operator to perform detecting and troubleshooting.

In the embodiments provided herein, it is to be understood that the disclosure is merely illustrative and may be implemented in other ways.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A cleaning device for a display panel, comprising:
   a frame comprising a body for mounting the cleaning device and a stand supporting the body;
   a water knife component comprising a water jet nozzle, a water supply tank connected to the water jet nozzle through a pipeline, and a regulating device controlling a spray intensity of the water jet nozzle;

a transfer component comprising a transport platform for transporting the display panel to be cleaned by the water jet nozzle;

a discharge component comprising a recycle tank for recycling sewage and a water cover covering two sides of the transport platform to prevent the sewage from splashing;

a detection component comprising a photosensor disposed in correspondence with the water jet nozzle to detect whether the water jet nozzle normally sprays a cleaning solution; and a control switch electrically connected to the photosensor, wherein the control switch suspends an operation of the cleaning device when the photosensor detects that the water jet nozzle abnormally sprays the cleaning solution.

2. The cleaning device according to claim 1, wherein the photosensor is disposed below the water jet nozzle.

3. The cleaning device according to claim 1, wherein the transport platform comprises roller stands and conveying rollers, the roller stands are arranged in parallel along a conveying direction, and the conveying rollers are parallelly interposed between the roller stands, one side of each of the roller stands is near the water jet nozzle.

4. The cleaning device according to claim 3, wherein the one side of each of the roller stands near the water jet nozzle is tilted up by a predetermined angle, so that the conveyed display panel meets the water jet nozzle at the predetermined angle in an upwardly tilted manner.

5. The cleaning device according to claim 3, wherein each of the conveying rollers comprises two sub-rollers, the two sub-rollers are fixed in a V shape, and an included angle of the V shape is directed to the conveying direction of the display panel.

6. The cleaning device according to claim 3, wherein surfaces of the conveying rollers are provided with anti-slip sleeves.

7. The cleaning device according to claim 1, wherein the water knife component further comprises:

a vibrator driving the water jet nozzle to vibrate back and forth horizontally in a direction perpendicular to a direction transporting the display panel.

8. The cleaning device according to claim 1, wherein a jetting direction of the water jet nozzle is tilted at a predetermined angle toward a direction in which the display panel is conveyed.

9. The cleaning device according to claim 1, wherein the pipeline between the water jet nozzle and the water supply tank comprises a detachable filter tube, and a filter is disposed inside the filter tube.

10. The cleaning device according to claim 1, further comprising:

a sewage loop component comprising a sewage purification tank connected to the recycle tank, and the sewage in the sewage purification tank is purified and then pumped, by a motor, to the water supply tank and is recycled.

11. The cleaning device according to claim 1, wherein the water cover is made of a transparent material.

12. A cleaning device for a display panel, comprising:

a frame comprising a body for mounting the cleaning device and a stand supporting the body;

a water knife component comprising a water jet nozzle, a water supply tank connected to the water jet nozzle through a pipeline, and a regulating device controlling a spray intensity of the water jet nozzle;

a transfer component comprising a transport platform for transporting the display panel to be cleaned by the water jet nozzle;

a discharge component comprising a recycle tank for recycling sewage, and a water cover covering two sides of the transport platform to prevent the sewage from splashing, wherein a surface of the water cover is provided with an operation window that may be pushed and pulled;

a detection component comprising a photosensor disposed in correspondence with the water jet nozzle to detect whether the water jet nozzle normally sprays a cleaning solution; and a control switch electrically connected to the photosensor, wherein the control switch suspends an operation of the cleaning device when the photosensor detects that the water jet nozzle abnormally sprays the cleaning solution;

wherein the transport platform comprises roller stands and conveying rollers, the roller stands are arranged in parallel along a conveying direction, the conveying rollers are parallelly interposed between the roller stands, each of the conveying rollers comprises two sub-rollers, the two sub-rollers are fixed in a V shape, and an included angle of the V shape is directed to a conveying direction of the display panel, one side of each of the roller stands is near the water jet nozzle.

13. The cleaning device according to claim 12, wherein the photosensor is disposed below the water jet nozzle.

14. The cleaning device according to claim 12, wherein the one side of each of the roller stands near the water jet nozzle is tilted up by a predetermined angle, so that the conveyed display panel meets the water jet nozzle at the predetermined angle in an upwardly tilted manner.

15. The cleaning device according to claim 12, wherein surfaces of the conveying rollers are provided with anti-slip sleeves.

16. The cleaning device according to claim 12, wherein a jetting direction of the water jet nozzle is tilted at a predetermined angle toward a direction in which the display panel is conveyed.

17. The cleaning device according to claim 12, wherein the pipeline between the water jet nozzle and the water supply tank comprises a detachable filter tube, and a filter is disposed inside the filter tube.

18. The cleaning device according to claim 12, further comprising:

a sewage loop component comprising a sewage purification tank connected to the recycle tank, and the sewage in the sewage purification tank is purified and then pumped, by a motor, to the water supply tank and is recycled.

19. The cleaning device according to claim 12, wherein the water knife component further comprises:

a vibrator driving the water jet nozzle to vibrate back and forth horizontally in a direction perpendicular to the conveying direction.

20. The cleaning device according to claim 12, wherein the water cover is made of a transparent material.

* * * * *